United States Patent [19]

Pashley

[11] 4,052,229

[45] Oct. 4, 1977

[54] PROCESS FOR PREPARING A SUBSTRATE FOR MOS DEVICES OF DIFFERENT THRESHOLDS

[75] Inventor: Richard D. Pashley, Mountain View, Calif.

[73] Assignee: Intel Corporation, Santa Clara, Calif.

[21] Appl. No.: 700,043

[22] Filed: June 25, 1976

[51] Int. Cl.² ............... H01L 21/265; H01L 29/78
[52] U.S. Cl. ...................... 148/1.5; 29/571; 148/187; 357/23; 357/41; 357/42; 357/91
[58] Field of Search ............ 148/1.5, 187; 357/41, 357/42, 91; 29/571

[56] References Cited

U.S. PATENT DOCUMENTS

| | | | |
|---|---|---|---|
| 3,653,978 | 4/1972 | Robinson et al. | 357/91 X |
| 3,731,372 | 5/1973 | Kraft | 148/187 X |
| 3,756,861 | 9/1973 | Payne et al. | 148/1.5 |
| 3,775,191 | 11/1973 | McQuhae | 148/1.5 |
| 3,898,105 | 8/1975 | Mai et al. | 148/1.5 |
| 3,916,430 | 10/1975 | Heuner et al. | 357/42 |
| 3,928,082 | 12/1975 | Schwettmann | 148/1.5 |
| 3,959,040 | 5/1976 | Robertson | 148/187 X |

*Primary Examiner*—L. Dewayne Rutledge
*Assistant Examiner*—W. G. Saba
*Attorney, Agent, or Firm*—Blakely, Sokoloff, Taylor & Zafman

[57] ABSTRACT

In a substrate, a process for forming a plurality of host regions of different conductivity types and dopant concentration levels. These various host regions include the channels of MOS field-effect devices, thereby providing devices of different voltage thresholds. Overlapping masking and doping provides numerous host regions with a minimum of masking.

13 Claims, 6 Drawing Figures

PROCESS FOR PREPARING A SUBSTRATE FOR MOS DEVICES OF DIFFERENT THRESHOLDS

BACKGROUND OF THE INVENTION

1. Field of the Invention

The invention relates to the field of MOS processing.

2. Prior Art

In the fabrication of large scale integrated MOS circuits it is often desirable to have devices (such as field-effect transistors) of different thresholds on the same substrate. One example where devices of different voltage thresholds are employed on a common substrate is the combination of depletion mode field-effect transistors and enhancement mode field-effect transistors. To fabricate these devices on a common substrate typically a separate masking step is employed to isolate the channel regions of the depletion mode devices. Then an appropriate dopant is diffused into the substrate. Following this the enhancement mode devices and depletion mode devices are simultaneously fabricated on the substrate.

It is useful in some applications to employ depletion mode and enhancement mode devices of different thresholds on the same substrate. A choice of voltage thresholds permits optimization of designs. However, if a separate masking step is required for each such threshold, fabrication considerations such as yield, make the use of different threshold devices less practical. With the present invention a plurality of host regions of different conductivity types and dopant concentration levels are formed, without the need for a separate masking step for each host region.

SUMMARY OF THE INVENTION

A process is described for preparing a silicon substrate during the fabrication of MOS devices. The process provides for the formation of a plurality of separate host regions in the substrate which permit devices having different voltage thresholds to be fabricated within the different regions. A first masking means is formed over a first area of a substrate. The substrate is subjected to a first dopant such that other than the first area of the substrate is doped. Next, a second masking means is formed over a second area of the substrate. This second masking means is coextensive with a portion of the first area. The substrate is then subjected to a second dopant such that other than the second area of the substrate is doped with this second dopant. In this manner the plurality of separate host regions are formed.

DETAILED DESCRIPTION OF THE INVENTION

A process for forming a plurality of host regions of different conductivity types and different dopant concentration levels in a silicon substrate is described. MOS devices having different voltage thresholds may then be fabricated in the plurality of host regions. In the presently preferred embodiment as will be described, two separate masking and doping steps are employed resulting in four host regions. This application also describes the fabrication of an inverter which includes an enhancement mode transistor and a depletion mode transistor on two of the regions. Simultaneously with the fabrication of this inverter the fabrication of other field-effect devices is described on the other host regions.

Numerous details of the presently preferred process, such as specific conductivity types, specific impurities, impurity concentration levels, processing times and temperatures have been included to provide a complete understanding of the invented process. However, as will be appreciated, variations of the described process may be employed; these variations will be obvious to one skilled in the art. In some instances, detailed descriptions of well-known photolithographic steps have not been included in order not to obscure the invented process in detail.

Figure 1:
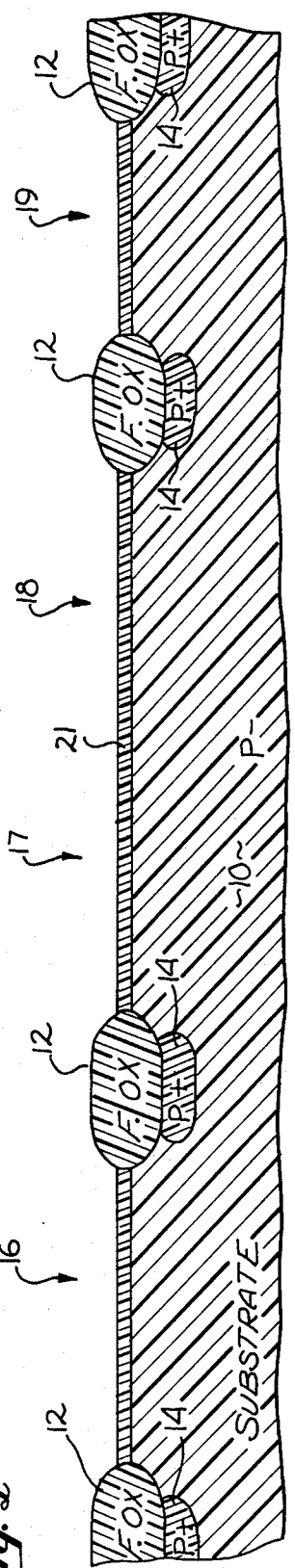
FIG. 1 is a cross-sectional elevation view of a portion of a silicon substrate which includes a plurality of spaced-apart field oxide regions.

Referring now to FIG. 1 and the elevation view of the monocrystalline silicon substrate 10, the surface of the substrate is divided for purposes of explanation into three major portions which are separated by field oxides 12. Channel stops 14 are disposed beneath each of the field-oxides 12. A silicon oxide (SiO, $SiO_2$) layer 21 is formed on the surface of the substrate. The field-oxide 12, the channel stops 14 and oxide layer 21 may be fabricated employing known "front-end" processing techniques. Field oxide 12 and channel stops 14 are not necessary to the present invention, although they are employed in the presently preferred embodiment. In the presently preferred embodiment the substrate 10 is lightly doped with a p-type dopant to a concentration level of approximately 50 ohm-cm. The channel stops 14 are heavily doped with a p-type dopant.

As shown in FIG. 1 four areas are designated on the substrate as area 16, 17, 18 and 19. These areas are exposed to different doping (particularly areas 17, 18 and 19) resulting in four host regions in the substrate 10. In the described embodiment, field-effect transistors are fabricated on areas 16 and 19, and the inverter (which includes a depletion mode transistor and an enhancement mode transistor) is formed on the areas 17 and 18.

Figure 2:
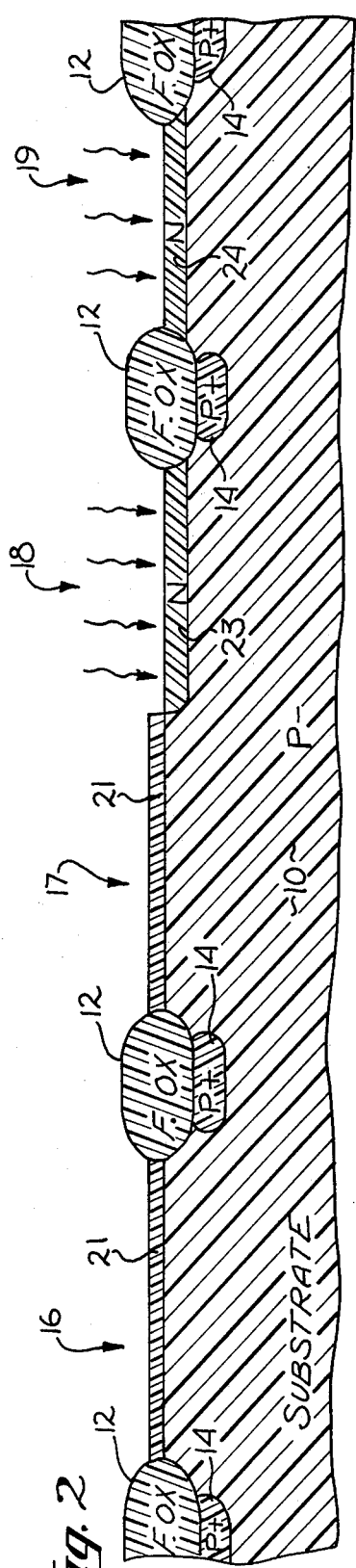
FIG. 2 illustrates the substrate of FIG. 1 with an oxide layer over a first area of the substrate and with the remainder of the substrate subjected to a first dopant.

A standard masking step is employed to etch the silicon oxide layer 21 from the areas 18 and 19 as shown in FIG. 2. Then an arsenic dopant is diffused into the substrate at areas 18 and 19 to form the doped n-type regions 23 and 24. In the presently preferred embodiment ion implanatation is employed to dope the regions 23 and 24; an energy level of 25 KEV is used to obtain a concentration level of approximately $0.8 \times 10^{12}/cm^2$. Note as shown in FIG. 2 the substrate area 16 and 17 are not doped by the arsenic dopant since they are protected by the oxide layer 21.

Figure 3:
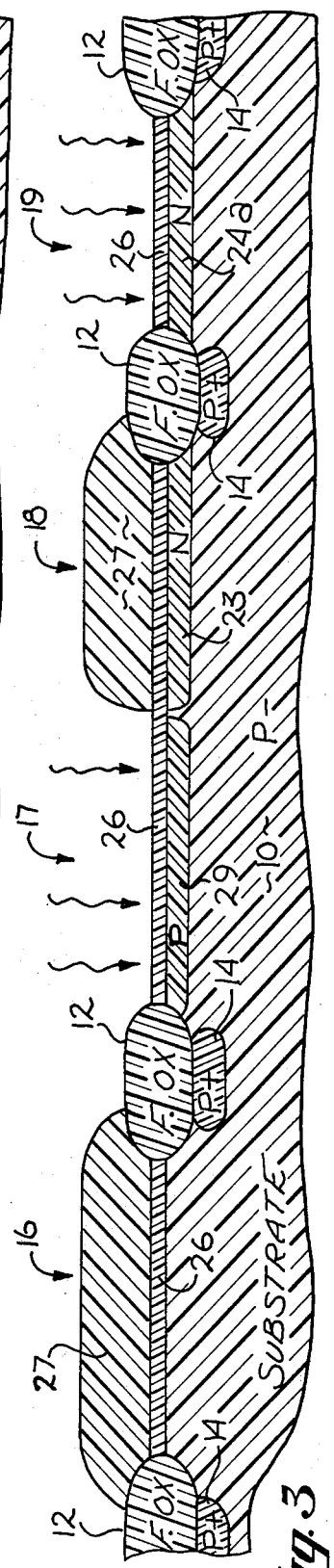
FIG. 3 illustrates the substrate of FIG. 2 with a photoresist masking means over a portion of the substrate and with the remainder of the substrate subjected to a second dopant.

Next the oxide layer 21 is removed employing a standard hydrofluoric etchant, and a gate oxide layer 26 is grown on the surface of the substrate (FIG. 3). In the presently preferred embodiment this gate oxide is approximately 700A thick. Following the formation of the gate oxide the substrate is annealed at approximately 1075° C in a nitrogen atmosphere.

As shown in FIG. 3 a photoresist masking layer 27 is formed on the substrate such that areas 16 and 18 are covered by this masking layer. Ordinary photolithographic techniques are employed in this masking operation. The substrate is then subjected to a boron dopant to form the doped host regions 29 and 24a at areas 17 and 19, respectively. A $B_{11}$ ion implantation doping step is used in the presently preferred embodiment at an energy level of approximately 50KEV to obtain a dopant concentration at area 17 of $0.35 \times 10^{12}/cm^2$. This energy level is sufficient to penetrate the oxide 26, however, the photoresist layer 27 prevents doping of the substrate at areas 16 and 18.

As now may be seen in FIG. 3 four different host regions are present in the surface of substrate 10. At area 16 the original substrate conductivity type and concentration level remains. A p-type region is present at area 17, an n-type dopant at area 18, and a lightly doped n-type region 24a at area 19. Two masking steps and two doping steps were employed to obtain these host regions. Where additional host regions of different conductivity types or concentration levels are required additional overlapping masking and doping steps may be employed to obtain any number of desired host regions.

Figure 4:
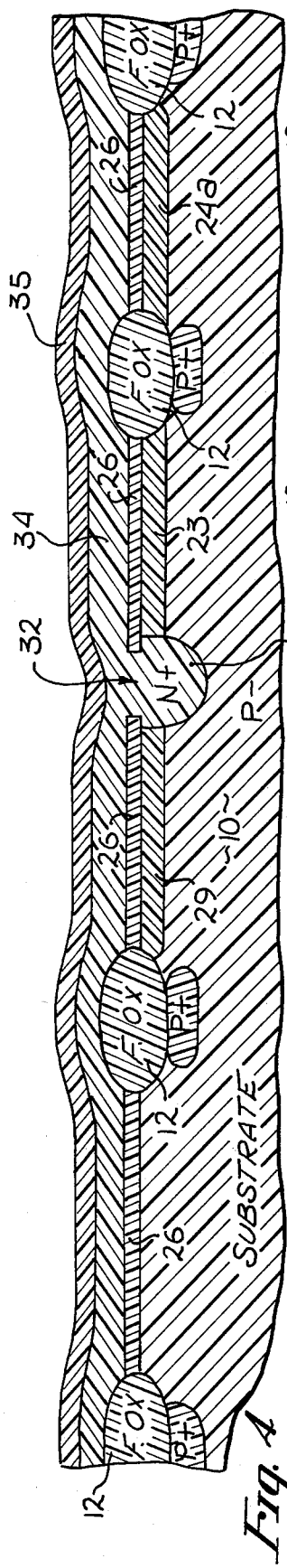
FIG. 4 illustrates the substrate of FIG. 3 with a buried contact region in the substrate and with a polycrystalline silicon layer and polycrystalline silicon oxide layer.

Referring now to FIG. 4 ordinary masking and etching processing is employed to form the window 32. Next a phosphorus doped polycrystalline silicon layer 34 and a polycrystalline oxide layer 35 (later employed for masking) are formed on layer 26 and in contact with the exposed silicon at window 32. Diffusion occurs from the doped polycrystalline silicon layer 34 to obtain the doped buried contact region 31.

Figure 5:
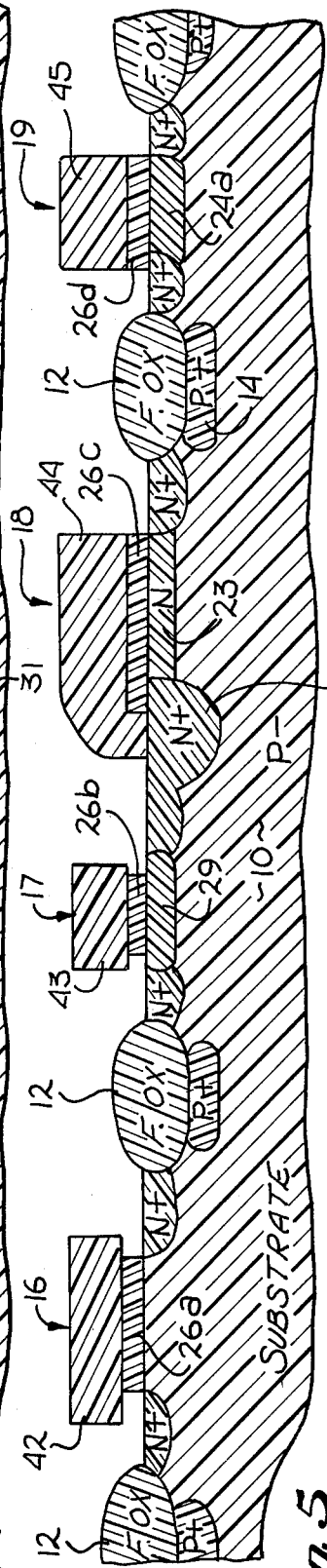
FIG. 5 illustrates the substrate of FIG. 4 with gates formed from the polycrystalline silicon layer and with source and drain regions formed in the substrate.

Next a positive photoresist is employed to etch the oxide layer 35 and to define the gates 42, 43, 44 and 45 shown in FIG. 5. In the presently preferred embodiment these gates are approximately 3±0.5 microns thick. The oxide layer 26 is etched to form gate oxide 26a for gate 42, gate oxide 26b for gate 43, gate oxide 26c for gate 44, and gate oxide 26d for gate 45. The gate 44 extends over the edge of the gate oxide 26c and contacts the substrate at region 31.

An arsenic dopant is then employed to form source and drain regions in alignment with gates 42, 43, 44 and 45. The source and drain regions formed in alignment with gate 43 contact region 29, the drain also contacts the buried contact region 31. The drain region associated with gate 44 contacts the n-type region 23. The source and drain regions formed in alignment with gate 45 contact the region 24a. Any one of a plurality of known arsenic diffusion steps may be employed to form the source and drain regions, other dopant such as phosphorus may also be employed.

Figure 6:
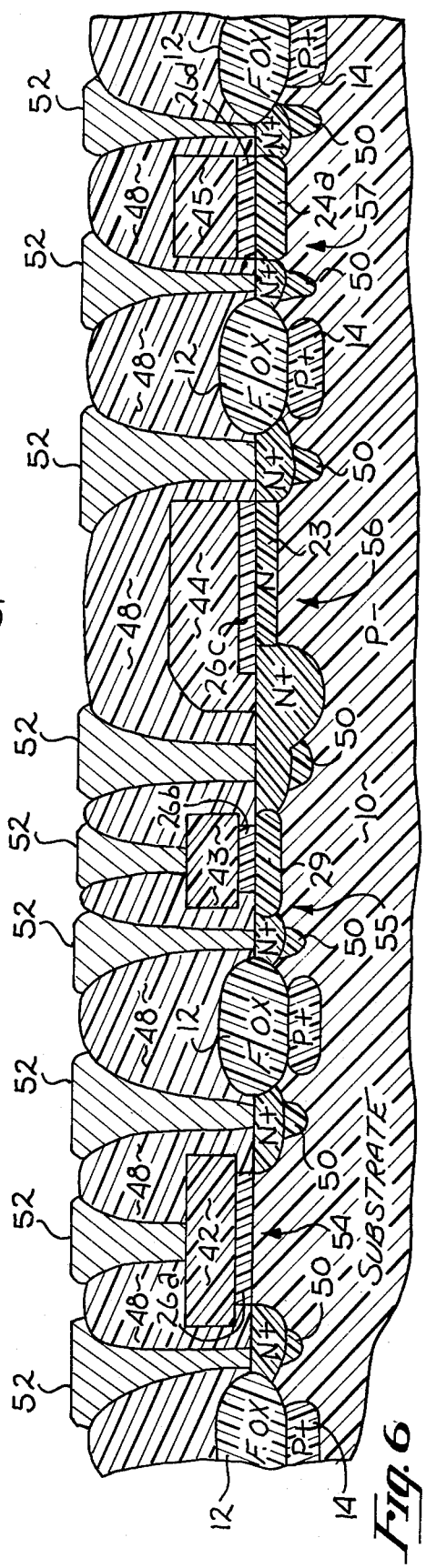
FIG. 6 illustrates the substrate of FIG. 5 with a glass layer and with metal contacts.

As shown in FIG. 6 the MOS devices may be completed employing known processes which include the formation of a glass layer 48 and metal contacts 52. "Anti-spiking" regions 50 may be formed in each of the source and drain regions as is well-known in the art. MOS field-effect transistors 54, 55, 56 and 57 are thus fabricated at areas 16, 17, 18 and 19, respectively.

The transistors 55 and 56 form a ordinary inverter having a depletion mode transistor 56 and an enhancement mode transistor 55. The depletion mode transistor 56 has a voltage threshold of approximately −3 volts, while the enhancement mode transistor 55 has a threshold of approximately 0.7V. The transistor 57 is a low conductance depletion mode transistor having a threshold of approximately −1 volt. This transistor is particularly useful as the load device in a bi-stable circuit such as are employed in static memories. When so employed transistor 57 is coupled in series with an enhancement mode transistor such as transistor 55. In this case areas equivalent to areas 17 and 19 as described above are contiguously formed, without an intermediate field oxide 12. As will be appreciated, any of the areas 16, 17, 18 and 19, or any combination thereof, may be contiguous. Transistor 54 has a voltage threshold of approximately ±0.3 volts, such devices may be useful, by way of example as transfer devices in sensing circuits.

Thus a plurality of transistors may be fabricated having different thresholds including depletion mode and enhancement mode transistors, on a low body effect substrate. A minimum of masking and doping steps are required to form the different host regions used for the channels of these transistors.

What is claimed is:

1. In the fabrication of MOS devices, a process for preparing a silicon substrate comprising the steps of:
   a. forming a first masking means over a first area of said substrate;
   b. subjecting said substrate to a first dopant such that portions thereof other than said first area of said substrate are doped with said first dopant;
   c. forming a second masking means over a second area of said substrate, said second area being coextensive with a portion of said first area;
   d. subjecting said substrate to a second dopant such that portions thereof other than said second area of said substrate are doped with said second dopant;
   said steps (a) through (d) resulting in four host regions in said substrate each having a different doping level such that when a field-effect transistor is formed in each of said host regions each such transistor may have a different threshold voltage;
   fabricating MOS devices in said host regions, each having a different threshold voltage.

2. The process defined by claim 1 wherein said substrate is p-type.

3. The process defined by claim 2 wherein said first dopant comprises arsenic.

4. The process defined by claim 3 wherein said first masking means comprises an oxide layer.

5. The process defined by claim 4 wherein said second dopant comprises boron.

6. The process defined by claim 5 wherein said second masking means comprises a photoresist layer.

7. The process defined by claim 6 wherein said boron dopant is ion implanted.

8. A process for preparing a p-type silicon substrate such that a plurality of devices of different threshold voltages may be fabricated on said substrate comprising the steps of:
   a. forming an oxide on said substrate;
   b. removing a portion of said oxide from said substrate so as to expose a first and second area on said substrate;
   c. subjecting said substrate to an n-type dopant such that said first and second areas of said substrate are doped;
   d. forming a masking layer on said substrate, said masking layer covering said second area and a fourth area and said masking layer leaving exposed said first area and a third area;

e. subjecting said substrate to a p-type dopant so as to simultaneously dope said first and third areas;

said steps (a) through (e) resulting in four host regions in said substrate each having a different doping level such that when a field-effect transistor is formed in each of said host regions each such transistor may have a different threshold voltage;

fabricating MOS devices in said host regions, each having a different threshold voltage.

9. The process defined by claim 8 wherein said masking layer comprises a photoresist layer.

10. The process defined by claim 8 wherein said n-type dopant comprises arsenic.

11. The process defined by claim 9 wherein said arsenic dopant is ion implanted.

12. The process defined by claim 8 wherein said p-type dopant comprises boron.

13. The process defined by claim 11 wherein said dopant ion is implanted.

* * * * *

REEXAMINATION CERTIFICATE (297th)
United States Patent [19]
Pashley

[11] B1 4,052,229
[45] Certificate Issued Jan. 15, 1985

[54] PROCESS FOR PREPARING A SUBSTRATE FOR MOS DEVICES OF DIFFERENT THRESHOLDS

[75] Inventor: Richard D. Pashley, Mountain View, Calif.

[73] Assignee: Intel Corporation, Santa Clara, Calif.

Reexamination Request:
No. 90/000,036, Jul. 28, 1981

Reexamination Certificate for:
Patent No.: 4,052,229
Issued: Oct. 4, 1977
Appl. No.: 700,043
Filed: Jun. 25, 1976

[51] Int. Cl.³ .................. H01L 21/265; H01L 29/78
[52] U.S. Cl. .................................. 148/1.5; 29/571; 148/187; 357/23; 357/41; 357/42; 357/91

[56] References Cited

U.S. PATENT DOCUMENTS

| | | | |
|---|---|---|---|
| 3,653,978 | 4/1972 | Robinson et al. | 148/1.5 |
| 3,731,372 | 5/1973 | Kraft | 29/590 |
| 3,753,806 | 8/1973 | Adamic | 357/52 X |
| 3,756,861 | 9/1973 | Payne et al. | 148/1.5 |
| 3,775,191 | 11/1973 | McQuhae | 148/187 X |
| 3,868,274 | 2/1975 | Hubar et al. | 148/1.5 |
| 3,898,105 | 8/1975 | Mai et al. | 148/1.5 |
| 3,928,082 | 12/1975 | Schwettmann et al. | 148/1.5 |
| 3,940,288 | 2/1976 | Takagi et al. | 148/1.5 |

OTHER PUBLICATIONS

Lee et al, "Ion-Implanted Semiconductor Devices", *Proceedings of the IEEE*, vol. 62, No. 9, Sep. 1974, pp. 1241-1255.

*Primary Examiner*—W. G. Saba

[57] ABSTRACT

In a substrate, a process for forming a plurality of host regions of different conductivity types and dopant concentration levels. These various host regions include the channels of MOS field-effect devices, thereby providing devices of different voltage thresholds. Overlapping masking and doping provides numerous host regions with a minimum of masking.

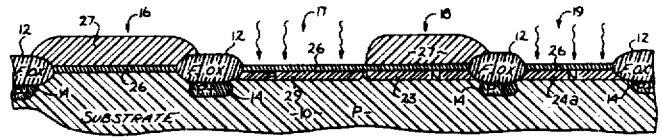

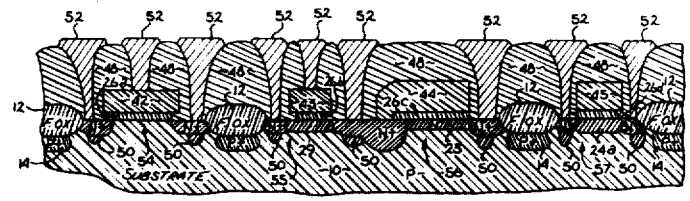

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-13 are cancelled.

* * * * *